United States Patent [19]

Kondo et al.

[11] Patent Number: 5,038,134
[45] Date of Patent: Aug. 6, 1991

[54] RELEASING CIRCUIT FOR ACTUATING VEHICULAR SAFETY DEVICE

[75] Inventors: Akira Kondo; Motoharu Naitou, both of Okazaki; Toshiaki Ota, Anjo; Mitsuhiko Masegi, Aichi; Masao Sakurai, Ohbu; Masahito Mutoh, Toyota; Motomi Iyoda, Seto, all of Japan

[73] Assignees: Nippondenso Co., Ltd., Kariya; Toyota Jidosha Kabushiki Kaisha, Toyota, both of Japan

[21] Appl. No.: 356,306

[22] Filed: May 24, 1989

[30] Foreign Application Priority Data

May 24, 1988 [JP] Japan .................. 63-126185

[51] Int. Cl.$^5$ ................... B60R 21/00
[52] U.S. Cl. ................... 340/438; 340/436; 280/735
[58] Field of Search .............. 340/436, 438, 669; 280/735, 734; 180/282; 307/10.1

[56] References Cited

U.S. PATENT DOCUMENTS

| | | | |
|---|---|---|---|
| 3,714,627 | 1/1973 | Dillman et al. | 340/436 X |
| 3,851,305 | 11/1974 | Baba et al. | 280/735 X |
| 3,911,391 | 10/1975 | Held et al. | |
| 3,964,016 | 6/1976 | Yamada et al. | |
| 4,016,426 | 4/1974 | Nishioka | 307/10.1 |
| 4,059,822 | 11/1977 | Toshioka et al. | 280/735 |
| 4,086,562 | 4/1978 | Hasegawa | 280/735 |
| 4,087,782 | 5/1978 | Oishi et al. | 280/735 X |
| 4,117,730 | 10/1978 | Spies et al. | |
| 4,243,971 | 1/1981 | Suchowerskyj et al. | 340/516 X |
| 4,346,913 | 8/1982 | Schrauf et al. | |
| 4,410,875 | 10/1983 | Spies et al. | 340/669 X |
| 4,851,705 | 7/1989 | Musser et al. | 280/735 X |

FOREIGN PATENT DOCUMENTS

| | | |
|---|---|---|
| 2184307 | 12/1973 | France . |
| 52-16282 | 5/1977 | Japan . |
| 61-24648 | 2/1986 | Japan . |
| 8801242 | 2/1988 | World Int. Prop. O. . |

Primary Examiner—Joseph A. Orsino
Assistant Examiner—Brian R. Tumm
Attorney, Agent, or Firm—Cushman, Darby & Cushman

[57] ABSTRACT

A releasing circuit for actuating a vehicular safety device includes a sensor arranged to provide an acceleration signal responsive to accelerations of the vehicle and an evaluating circuit for setting a predetermined condition for activating a release element of the safety device and responsive to the acceleration signal for effecting the activation of the release element when the predetermined condition has been satisfied by the acceleration signal. A checking circuit for the releasing circuit includes a check signal generator for producing therefrom a check signal at a predetermined level which does not satisfy the predetermined condition and for applying the check signal to a circuit between the sensor and evaluating circuit, a comparator responsive to the check signal for determining as to whether or not there is a defect or malfunction in the circuit between the second and evaluating circuit, and a second comparator responsive to an output signal of the evaluating circuit for ascertaining as to whether or not the release element has been properly activated in response to the acceleration signal under control of the evaluating circuit.

10 Claims, 3 Drawing Sheets

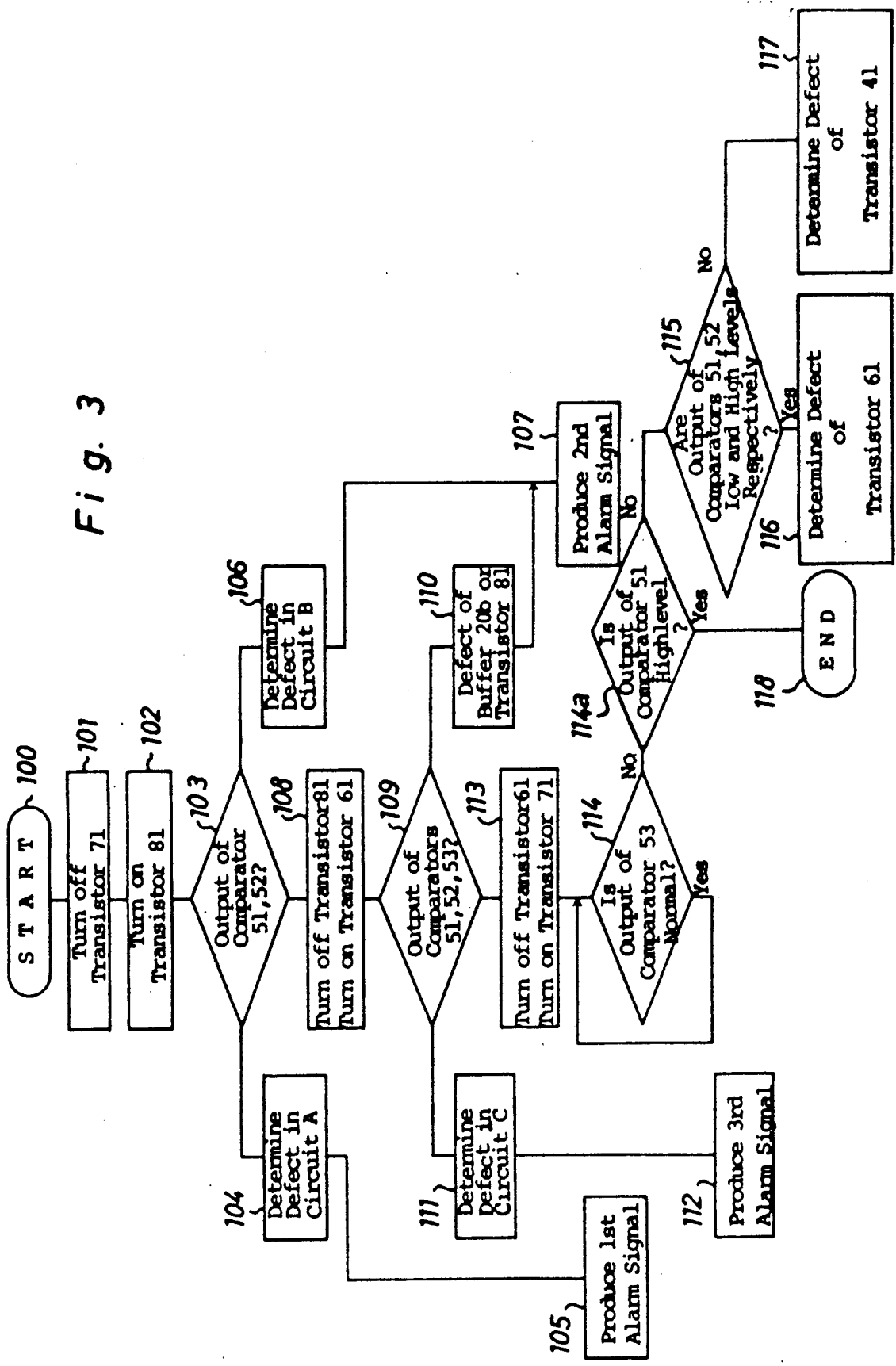

RELEASING CIRCUIT FOR ACTUATING VEHICULAR SAFETY DEVICE

BACKGROUND OF THE INVENTION

1. Field of the Invention

The present invention relates to vehicular safety devices such as air cushions, belt tighteners or similar arrangements, and more particularly to a checking circuit for checking a defect or malfunction in a releasing circuit for the safety devices.

2. Discussion of the Prior Art

For checking a defect or malfunction in the releasing circuit, a prior art checking circuit is designed to generate a check signal for the releasing circuit therefrom and apply it to an evaluating circuit in the releasing circuit in such a manner as to render an ignition element of the safety device in an operable condition. Such a checking circuit, is unable to discriminate a defect or malfunction in a circuit between an electromechanical transducer and the evaluating circuit. It is also unable to ascertain as to whether the ignition has been properly activated or not after an accident of the vehicle.

SUMMARY OF THE INVENTION

It is, therefore, an object of the present invention to provide a checking circuit for the releasing circuit capable of checking a defect or malfunction in respective components of the releasing circuit before an accident of the vehicle.

Another object of the present invention is to provide a checking circuit having the above-mentioned characteristics and capable of ascertaining after an accident as to whether a release or ignition element of the safety device has been properly activated or not.

According to the present invention, the foregoing objects are attained by providing a releasing circuit for actuating a safety device to protect passengers of a vehicle, which comprises an acceleration sensor in the form of an electromechanical transducer arranged to provide an electric acceleration signal responsive to accelerations of the vehicle and an evaluating circuit for setting a predetermined condition for activating a release element or ignition element of the safety device and responsive to the acceleration signal from the sensor for effecting the activation of the release element when the predetermined condition has been satisfied by the acceleration signal, wherein a checking circuit for the releasing circuit comprises a check signal generator for producing therefrom a check signal at a predetermined level which does not satisfy a portion of the predetermined condition for activation of the release element and for applying the check signal to a circuit between the sensor and evaluating circuit, means responsive to the check signal from the signal generator for determining as to whether or not there is a defect or malfunction in the circuit between the sensor and evaluating circuit, and means responsive to an output signal of the evaluating circuit for ascertaining as to whether or not the release element has been properly activated in response to the acceleration signal from the sensor under control of the evaluating circuit.

Preferably, the evaluating circuit comprises first means responsive to the acceleration signal from the sensor for producing an output signal therefrom when the predetermined condition has been satisfied by the acceleration signal and second means for effecting the activation of the release element in response to the output signal from the first means, and the means responsive to the check signal is arranged to determine as to whether or not the check signal is applied at a predetermined level to the first means of the evaluating circuit.

It is also preferable that the checking circuit further comprises a second check signal generator for producing therefrom a second check signal capable of activating the release element under control of the evaluating circuit and for applying the second check signal to the evaluating circuit and means responsive to the second check signal from the second signal generator for determining a defect or malfunction in the evaluating circuit. In this arrangement, the means responsive to the second check signal is further arranged to ascertain as to whether or not the release element is made in an operable condition in response to the second check signal under control of the evaluating circuit.

In a preferred embodiment, the evaluating circuit is arranged to effect the activation of the release element when applied with the acceleration signal from the sensor at a higher level than a predetermined value for a predetermined period of time, and the first-named check signal generator is arranged to produce therefrom a check signal at a lower level than the predetermined value.

BRIEF DESCRIPTION OF THE DRAWINGS

Other objects, features and advantages of the present invention will be readily appreciated from the following detailed description of a preferred embodiment thereof when considered with reference to the accompanying drawings, in which:

FIG. 3 is a flow chart of a program executed by a computer in the checking circuit.

DESCRIPTION OF THE PREFERRED EMBODIMENT

Figure 1:
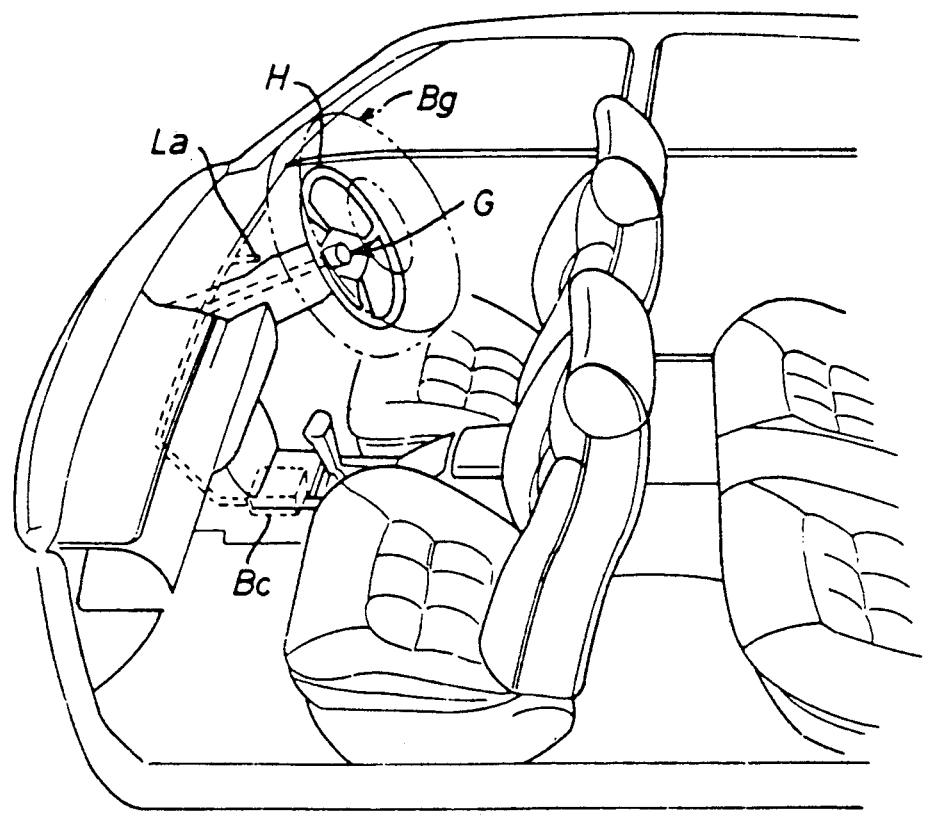
FIG. 1 is a partly cut away elevation of an automobile equipped with an air cushion system for the driver.
Figure 2:
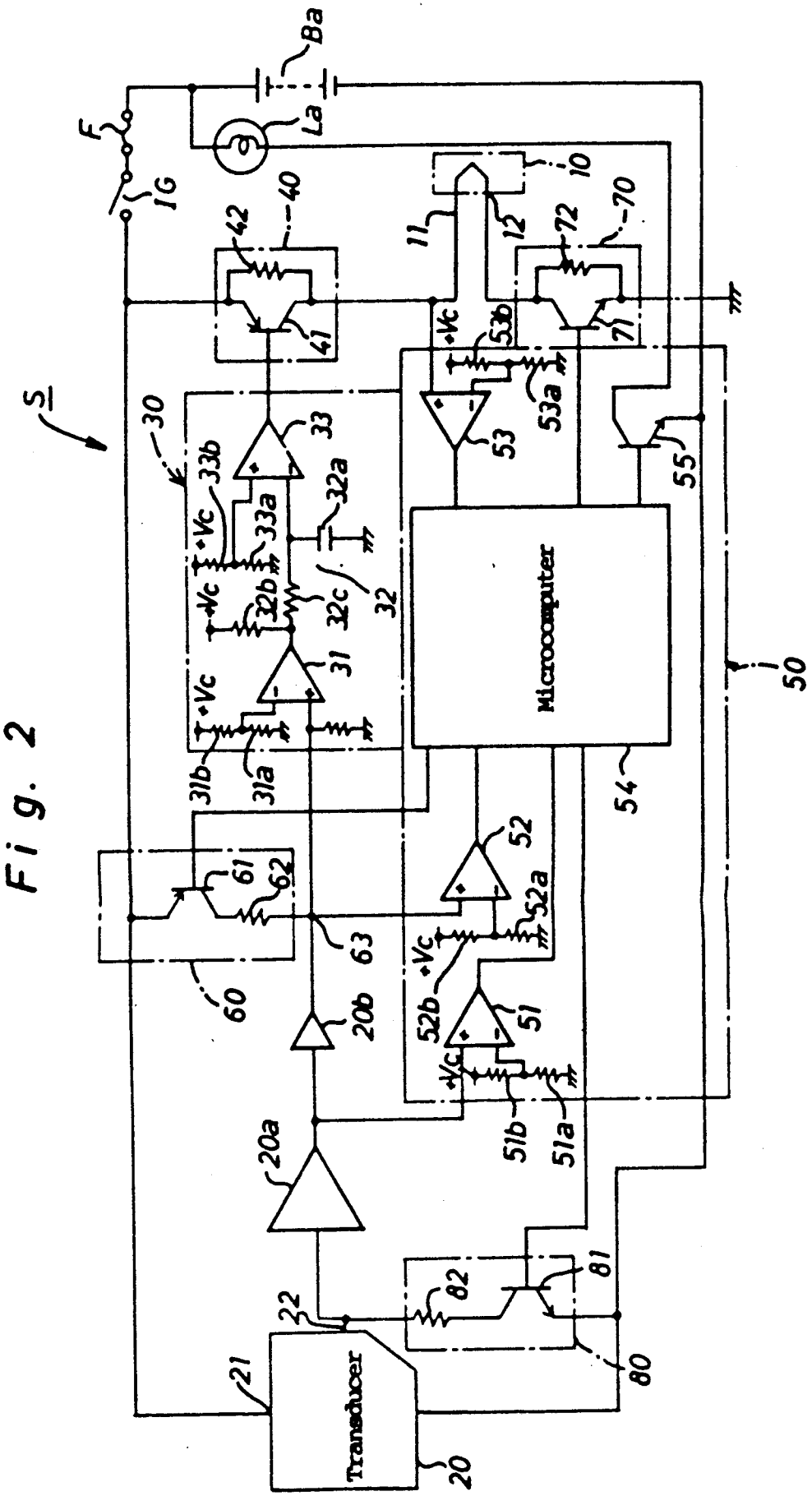
FIG. 2 is a circuit diagram of a releasing circuit with a checking circuit in accordance with the present invention.

Disclosed in FIG. 1 of the drawings is an automobile equipped with an air cushion system which includes an air bag Bg for the driver disposed within a steering wheel H, a gas generator G mounted in the air bag Bg, and a releasing circuit unit S in a control box Bc arranged in the vehicle compartment. The gas generator G is provided therein with an ignition element 10 which is energized by an input current applied thereto under control of the releasing circuit to burst the gas generator for rapidly inflating the air bag Bg.

The releasing circuit unit S includes an electromechanical transducer 20 in the form of a piezoelectric crystal for providing an electric acceleration signal responsive to acceleration of the vehicle and an evaluating circuit 30 for evaluating the acceleration signal applied thereto from transducer 20. A source terminal 21 of transducer 20 is connected to a voltage source in the form of a vehicle battery Ba through a fuse F and a vehicle ignition switch IG. An amplifier 20a is connected to an output terminal 22 of transducer 20 to amplify the electric acceleration signal applied thereto from transducer 20, and a buffer 20b is connected in series with the amplifier 20a to be conductive when biased in order by the amplified acceleration signal applied thereto from amplifier 20a. When biased in reverse, the buffer 20b becomes non-conductive.

The evaluating circuit 30 includes a comparator 31 connected at its positive input to the buffer 20b and at its negative input to a first voltage divider composed of two resistors 31a and 31b. The resistors 31a and 31b are arranged to divide a source voltage (+Vc) from battery Ba into a first reference voltage which corresponds with a slightly lower value than a vehicular acceleration necessary for activating the ignition element 10. The comparator 31 is designed to produce a low level signal therefrom when applied with an amplified acceleration signal from buffer 20b at a lower level than the first reference voltage and to produce a high level signal therefrom when applied with an amplified acceleration signal from buffer 20b at a higher level than the first reference voltage.

The evaluating circuit 30 further includes an integrator 32 having a capacitor 32a responsive to the high level signal from comparator 31 to be charged by the source voltage applied thereto through resistors 32b and 32c. Namely, the integrator 32 is arranged to produce an integrated voltage at a common terminal between the resistor 32c and capacitor 32a when charged in response to the high level signal from comparator 31. When applied with the low level signal from comparator 31, the charged voltage of capacitor 32a decreases quickly. A comparator 33 is connected at its negative input to the integrator 32 and at its positive input to a second voltage divider composed of two resistors 33a and 33b. The resistors 33a and 33b are arranged to divide the source voltage (+Vc) from battery Ba into a second reference voltage which corresponds with a voltage value necessary for effecting activation of the ignition element 10. The comparator 33 is designed to produce a high level signal therefrom when applied with an integrated voltage from capacitor 32a at a lower level than the second reference voltage and to produce a low level signal therefrom when applied with an integrated voltage from capacitor 32a at a higher level than the second reference voltage. A switching circuit 40 includes a transistor 41 and a resistor 42 of high resistance disposed between the emitter and collector of transistor 41. The transistor 41 is connected at its base to the comparator 33 and at its emitter to the battery Ba through the vehicle ignition switch IG and fuse F. The collector of transistor 41 is connected to one terminal 11 of the ignition element 10. The transistor 41 is energized when applied with the low level signal from comparator 33 and is deenergized when applied with the high level signal from comparator 33.

A checking circuit 50 for the releasing circuit unit S includes a comparator 51 connected at its positive input to a circuit between the amplifier 20a and buffer 20b and at its negative input to a third voltage divider composed of two resistors 51a and 51b. The resistors 51a and 51b are arranged to divide the source voltage into a third reference voltage. The comparator 51 is designed to produce a high level signal therefrom when applied with an amplified voltage from amplifier 20a at a higher level than the third reference voltage and to produce a low level signal therefrom when applied with an amplified voltage from amplifier 20a at a lower level than the third reference voltage. In this embodiment, the third reference voltage is determined to be lower than an amplified voltage applied from the amplifier 20a in a condition where the level of the amplified voltage becomes lower than the first reference voltage defined by resistors 31a, 31b when the amplifier 20a has been applied with a check signal from a first check signal generator 80. In other words, the comparator 51 is designed to produce the high level signal therefrom when applied with the amplified check signal from signal generator 80 through amplifier 20a in a condition where the comparator 31 does not produce any high level signal therefrom even if it has been applied with the same amplified check signal from amplifier 20a through buffer 20b.

The checking circuit 50 further includes a comparator 52 connected at its positive input to a second check signal generator 60 and at its negative input to a fourth voltage divider composed of two resistors 52a and 52b. The resistors 52a and 52b are arranged to divide the source voltage into a fourth reference voltage which corresponds with the third reference voltage defined by resistors 51a and 51b. The comparator 52 is designed to produce a high level signal therefrom when applied with a second check signal from signal generator 60 at a higher level than the fourth reference voltage.

The checking circuit 50 further includes a comparator 53 connected at its positive input to the one terminal 11 of ignition element 10 and at its negative input to a fifth voltage divider composed of two resistors 53a and 53b. The resistors 53a and 53b are arranged to divide the source voltage into a fifth reference voltage. The comparator 53 is designed to produce a high level signal therefrom when applied with a terminal voltage of ignition element 10 at a higher level than the fifth reference voltage and to produce a low level signal therefrom when applied with a terminal voltage of ignition element 10 at a lower level than the fifth reference voltage. In this embodiment, the fifth reference voltage is determined taking into consideration a ratio to the sum of resistance values of resistor 42, ignition element 10 and a resistor 72 disposed between the collector and emitter of a transistor 71 for prohibition. A switching circuit 70 for prohibition is composed of the transistor 71 and resistor 72. The transistor 71 is connected at its base to a microcomputer 54 and at its collector to the other terminal of ignition element 10. The emitter of transistor 71 is grounded.

Assuming that the transistor 41 of switching circuit 40 has been energized during deenergization of transistor 71, the ignition element 10 is maintained in a deactivated condition under control of the resistor 72 even if applied at its one terminal with the source voltage from battery Ba at a higher level than the fifth reference voltage. In such a condition, the input current to ignition element 10 is restrained in a slight value. When both the transistors 41 and 71 are energized to short the resistors 42 and 72, the ignition element 10 is activated by the source voltage applied thereto from the battery Ba through fuse F, ignition switch IG and transistor 41.

The checking circuit further includes a transistor 55 connected at its base to the computer 54 and at its collector to an alarm lamp La in connection to the positive terminal of battery Ba. The emitter of transistor 55 is connected to the negative terminal of battery Ba. The microcomputer 54 is arranged to cooperate with the comparators 51, 52 and 53 for execution of a computer program illustrated by a flow chart in FIG. 3. The computer has a read-only memory arranged to previously store the program. During execution of the program, the computer 54 carries out process control of the transistor 55, check signal generators 60, 80 and switching circuit 70 as will be described in detail later.

The first check signal generator 80 includes a transistor 81 connected at its base to the computer 54 and at its emitter to the negative terminal of battery Ba. The collector of transistor 81 is connected to an input terminal of amplifier 20a through a resistor 82. When the transistor 81 is energized under control of the computer 54, the resistor 82 generates a first check signal therefrom and applies it to the input terminal of amplifier 20a. The resistance value of resistor 82 is determined in such a manner that during energization of the transistor 81 the level of an amplified check signal from amplifier 20a becomes lower than the first reference voltage defined by resistors 31a, 31b and higher than the third reference voltage defined by resistors 51a, 51b. The check signal from resistor 82 will disappear in response to deenergization of the transistor 81.

The second check signal generator 60 includes a transistor 61 connected at its base to the computer 54 and at its emitter to the positive terminal of battery Ba through the vehicle ignition switch IG and fuse F. The collector of transistor 61 is connected to the positive input of comparator 52 through a resistor 62. When the transistor 61 is energized under control of the computer 54, the resistor 62 generates at a point 63 a second check signal therefrom at a higher level than the first, second and fourth reference voltages respectively defined by resistors 31a, 31b; 33a, 33b; and 52a, 52b. The second check signal from resistor 62 will disappear in response to deenergization of transistor 61.

Hereinafter the checking cycle of the checking circuit 50 for the releasing circuit 30 will be described with reference to the flow chart of FIG. 3. Assuming that the ignition switch IG has been closed to start a prime mover of the vehicle, the computer 54 is supplied with the source current from battery Ba to initiate execution of the computer program at step 100. At step 101, the computer 54 acts to deenergize the transistor 71 and causes the program to proceed to step 102 where it produces an output signal for energization of the transistor 81. Thus, both the transistors 41 and 71 are maintained in a deenergized condition, while the transistor 81 is energized in response to the output signal from computer 54 to generate a first check signal therefrom and apply it to the amplifier 20a through resistor 82. In turn, the buffer 20b is applied with an amplified check signal from amplifier 20a in a condition where the transducer 20 does not produce any electric acceleration signal therefrom. Since the first check signal applied through buffer 20b is maintained at a lower level than the first reference voltage, the comparator 31 produces a low level signal therefrom to maintain the transistor 41 in the deenergized condition.

In the case that the comparator 51 is applied with the amplified check signal from amplifier 20a at a higher level than the third reference voltage defined by resistors 51a, 51b and that the comparator 52 is applied with the amplified check signal through buffer 20b at a higher level than the fourth reference voltage defined by resistors 52a, 52b, both the comparators 51 and 52 produce a high level signal therefrom. This means that a circuit A including the transducer 20, amplifier 20a and buffer 20b is maintained in a normal condition. If both the comparators 51 and 52 produce a low level signal therefrom, there will be a defect or malfunction in the circuit A, for instance, disconnection between the transducer 20 and amplifier 20a. If the comparator 51 produces a high level signal therefrom while the comparator 52 produces a low level signal therefrom, there will be a defect or malfunction in an input or output circuit B of buffer 20b, for instance, disconnection of an input or output leading wire of buffer 20b.

When the program proceeds to step 103, the computer 54 determines each level of the output signals of comparators 51 and 52. If received both the output signals of comparators 51, 52 at a low level, the computer 54 causes the program to proceed to step 104 where it determines a defect or malfunction in the circuit A. At the following step 105, the computer 54 produces a first alarm signal therefrom and applies it to the transistor 55. Thus, the transistor 55 is energized by the alarm signal from computer 54 to continuously light the alarm lamp La for informing the drive of the defect or malfunction. If received at step 103 the output signal of comparator 51 at a high level and the output signal of comparator 52 at a low level, the computer 54 causes the program to proceed to step 106 where it determines a defect or malfunction in the circuit B. At the following step 107, the computer 54 intermittently produces a second alarm signal therefrom and applies it to the transistor 55. Thus, the transistor 55 is intermittently energized by the second alarm signal from computer 54 to intermittently light the alarm lamp La for informing the driver of the defect or malfunction in the circuit B.

If received at step 103 both the output signals of comparators 51 and 52 at a high level, the computer 54 causes the program to proceed to step 108 where it acts to deenergize the transistor 81 and produces an output signal for energization of the transistor 61 of second check signal generator 60. Thus, the transistor 81 of first check signal generator 80 is maintained in a deenergized condition to make the amplified first check signal from amplifier 20a disappear, while the transistor 61 is energized in response to the output signal from computer 54 to generate a second check signal therefrom and apply it to the comparator 52 through resistor 62. When applied with the second check signal from transistor 61 at a higher level than the fourth reference voltage defined by resistors 52a, 52b, the comparator 52 produces a high level signal therefrom. On the other hand, the comparator 33 of evaluating circuit 30 produces a low level signal therefrom in response to the second check signal applied thereto from transistor 61 through comparator 31 and integrator 32 and applies it to the transistor 41 of switching circuit 40. In turn, the transistor 41 is energized in response to the low level signal from comparator 33 to permit the source voltage applied to the one terminal 11 of ignition element 10 therethrough, and the comparator 53 produces a high level signal therefrom due to the terminal voltage of ignition element 10. This means that a circuit C including the evaluating circuit 30 and switching circuit 40 is maintained in a normal condition. If the output signal of comparator 52 produces at a high level while the output signal of comparator 53 produces at a low level, there will be a defect of malfunction in the circuit C, for instance, disconnection in the evaluating circuit 30. If the comparator 51 produces a high level signal therefrom during deenergization of the transistor 81, there will be a defect or malfunction in the circuit B, for instance, short of the buffer 20b or unexpected energization of the transistor 81.

When the program proceeds to step 109, the computer 54 determines each level of the output signals of comparators 51, 52 and 53. If received the output signal from comparator 51 at a high level, the computer 54 causes the program to proceed to step 110 where it determines a defect or malfunction in the circuit B. At the following step 107, the computer 54 intermittently produces a second alarm signal therefrom and applies it to the transistor 55. Thus, the transistor 55 is intermittently energized by the second alarm signal from computer 54 to intermittently light the alarm lamp La for informing the driver of the defect or malfunction in the circuit B. If received at step 109 the output signal from comparator 52 at a high level and the output signals from comparators 51, 53 at a low level, the computer 54 causes the program to proceed to step 111 where it determines a defect or malfunction in the circuit C. At the following step 112, the computer 54 intermittently produces a third alarm signal therefrom at a different frequency from the second alarm signal and applies it to the transistor 55. Thus, the transistor 55 is intermittently energized by the third alarm signal from computer 54 to intermittently light the alarm lamp La for informing the drive of the defect or malfunction in the circuit C.

If received at step 109 the output signal from comparator 51 at a low level and the output signals from comparators 52, 53 at a high level, the computer 54 causes the program to proceed to step 113 where it determines the fact that all the circuits A, B and C are in a normal condition. At step 113, the computer 54 acts to deenergize the transistor 61 of check signal generator 60 and produces an output signal for energization of the transistor 71. When applied with the output signal from computer 54, the transistor 71 is energized to short the resistor 72 of switching circuit 70, and the comparator 53 is conditioned to produce a low level signal therefrom during deenergization of the transistor 41. As a result, the ignition element 10 is conditioned to be activated under control of the releasing circuit unit S.

When the program proceeds to step 114, the computer 54 will repeatedly determine a "Yes" answer until it is applied with a high level signal from comparator 53. Assuming that the ignition element 10 has been activated in response to energization of the transistor 41 under control of the releasing circuit 30 to burst the gas generator G for rapidly inflating the air bag Bg, the comparator 53 produces a high level signal therefrom if it has been maintained in a normal condition. When applied with the high level signal from comparator 53, the computer 54 determines a "No" answer at step 114 and causes the program to proceed to step 114a where it determines as to whether the output signal of comparator 51 is at a high level or not. If the answer is "Yes", the computer 54 will end execution of the program. If the answer is "No", the computer 54 causes the program to proceed to step 115. When applied at step 115 with the output signals of comparators 51 and 52 at a high level, the computer 54 determines the fact that the ignition element 10 was properly activated by an electric acceleration signal applied to the evaluating circuit 30 through the amplifier 20a and buffer 20b without any error. If applied at step 115 with the output signal of comparator 51 at a low level and the output signal of comparator 52 at a high level, the computer 54 determines a "Yes" answer and causes the program to proceed to step 116 where it determines a defect or malfunction of transistor 61 and memorizes the same therein. If applied at step 115 with the output signals of comparators 51 and 52 at a low level, the computer 54 determines a "No" answer and causes the program to proceed to step 117 where it determines a defect or malfunction of the transistor 41 and memorizes the same therein. Thus, it is able to ascertain as to whether or not the activation of ignition element 10 was caused by malfunction of the transistor 41 or 61 in a reliable manner.

Assuming that an abnormal change resulting from an accident occurs in travel speed of the vehicle during execution of the program at step 114, an electric acceleration signal from transducer 20 is amplified by the amplifier 20a and applied through buffer 20b to the evaluating circuit 30 to produce a low level signal from its comparator 33. In response to the low level signal from comparator 33, the transistor 41 is energized to permit the source voltage applied therethrough to the ignition element 10 from the battery Ba. Thus, the ignition element 10 is properly activated to burst the gas generator G for rapidly inflating the air bag Bg.

From the above description, it will be understood that the checking circuit 50 is useful to ascertain a defect or malfunction in respective components of the releasing circuit unit S and to ascertain after an accident as to whether or not the ignition element 10 was properly activated in response to an electric acceleration signal from transducer 20.

Although in the above embodiment the checking circuit of the present invention has been adapted to a releasing circuit for an air cushion system, it may be adapted to a releasing circuit for a seat belt tightener or similar protective shock absorbing device.

What is claimed is:

1. A checking circuit for a releasing circuit for actuating a safety device to protect passengers of a vehicle, of the type that has an acceleration sensor arranged to provide an electric acceleration signal responsive to acceleration of the vehicle and an evaluating circuit for setting a predetermined condition for activating a release element of the safety device and responsive to the acceleration signal from said sensor for effecting the activation of said release element when the predetermined condition has been satisfied by the acceleration signal, and producing a first output signal indicative thereof, said checking circuit comprising:
a check signal generator for producing therefrom a check signal at a predetermined level which does not satisfy at least a portion of the predetermined condition for activation of said release element and for applying the check signal to a circuit between said sensor and said evaluating circuit;
first means responsive to said first output signal when the check signal from said check signal generator is applied thereto for determining whether or not there is a defect or malfunction in said evaluating circuit in a condition where said evaluating circuit is being applied with the check signal; and
second means responsive to said first output signal for ascertaining whether or not said release element has been properly activated in response to the acceleration signal from said sensor under control of said evaluating circuit,
wherein said second means includes a computer and said check signal generator includes a transistor connected at its base to said computer and at its collector to the circuit between said sensor and said evaluating circuit through a resistor and grounded at its emitter, said computer being arranged to activate said clock signal generator in a predetermined sequence, and said resistor being arranged to produce the check signal at the predetermined level.

2. A releasing circuit as recited in claim 1, wherein said means responsive to the check signal comprises a comparator connected at its positive input to the circuit between said sensor and said evaluating circuit and at its negative input to a reference voltage, said comparator being arranged to produce a first output signal indicative of a normal condition of said evaluating circuit when applied with the check signal at a higher level than the reference voltage and to produce a second output signal indicative of a defect or malfunction in said evaluating circuit when applied with the check signal at a lower level than the reference voltage.

3. A releasing circuit as recited in claim 2, wherein said means responsive to an output signal of said evaluating circuit comprises a comparator connected at its positive input to an output terminal of said evaluating circuit and at its negative input to a second reference voltage, said comparator being arranged to produce a first output signal indicative of an operable condition of the safety device when applied with the output signal from said evaluating circuit at a higher level than the second reference voltage and to produce a second output signal indicative of an inoperable condition of the safety device when applied with the output signal from said evaluating circuit at a lower level than the second reference voltage, and wherein said signal responsive means includes means responsive to the output signals from both said comparators for ascertaining if said release element has been properly activated.

4. A releasing circuit for a safety device having a release element which is activated when supplied with a sufficient current for activation thereof from an electric power source, the safety device being actuated responsive to activation of the release element to protect passengers of a vehicle, comprising:
an acceleration sensor arranged to provide an acceleration signal responsive to acceleration of the vehicle,
a first leading circuit connected to said acceleration sensor, and producing a first output signal;
an evaluating circuit connected to said first leading circuit for evaluating said first output signal to determine a predetermined evaluating condition for supply of the sufficient current to the release element and for generating an evaluating signal when the evaluated result has satisfied the predetermined evaluating condition,
switching means for permitting supply of a small amount of current, less than said sufficient current, to the release element from said power source when switched into a first conducting state and for permitting supply of the sufficient current to the release element from said power source when switched in a second conducting state thereof,
current regulation means for regulating an amount of current supplied by said power source, to supply the small amount of current to the release element from said power source during at least the first conducting state of said switching means and to supply the sufficient current to the release element in response to generation of the evaluating signal during the second conducting state of said switching means, and
a checking circuit for the releasing circuit which comprises:
a) a check signal generator for generating a check signal which does not satisfy the predetermined evaluating condition and for applying the check signal to said first leading circuit,
b) first means for determined whether or not said first output signal responsive to the check signal during the first conducting state of said switching means satisfies a predetermined check condition indicative of normal operation of said first leading circuit, if not, determining a defect or malfunction of said first leading circuit, and
c) second means for determining whether or not said first output signal during a time that said check signal is not being produced and in the second conducting state of said switching means, satisfies the predetermined evaluating condition in relation to supply of the sufficient current to the release element from said power source, if so, determining proper activation of the release element and if not, determining erroneous activation of the release element.

5. A releasing circuit as claimed in claim 4, wherein the checking circuit further comprises a buffer element connected at its input to said acceleration sensor through said first leading circuit and connected at its output to said evaluating circuit through a second leading circuit, said buffer element being arranged to permit only applying of said first output signal from said first leading circuit to said second leading circuit therethrough,
wherein said first means includes means for determining whether or not said first output signal and a second output signal of said second leading circuit, responsive to applying of the check signal to said first leading circuit during the first conducting state of said switching means, satisfy the predetermined check condition, said first means also including means for determining a defect or malfunction of said first leading circuit when said first and second output signals do not satisfy the predetermined check condition with each other and for determining a defect or malfunction of said second leading circuit when only said second output signal does not satisfy the predetermined check condition, and
wherein said second means includes means for determining whether or not said first and second output signals responsive to the check signal not being produced during the second conducting state of said switching means satisfy the predetermined evaluating condition to each other in relation to supply of the sufficient current to the release element from said power source, if so, determining proper activation of the release element and if not, determining erroneous activation of the release element caused by a defect or malfunction of said current regulating means.

6. A releasing circuit for a safety device having a release element which is actuated when supplied with a sufficient current for activation thereof from an electric power source, the safety device being actuated responsive to activation of the release element by a release signal applied thereto to protect passengers of a vehicle, comprising:
an acceleration sensor arranged to provide an acceleration signal responsive to acceleration of the vehicle,
a first leading circuit connected to said acceleration sensor and producing a first output signal;
an evaluating circuit connected to said first leading circuit for evaluating said first output signal in relation to a predetermined evaluating condition for supply of the sufficient current to the release element and for generating an evaluating signal when the evaluated result has satisfied the predetermined evaluating condition, switching means for permitting supply of a small current, less than said sufficient amount, to the release element as said release signal from said power source when switched into a first conducting state thereof and for permitting supply of the sufficient current to the release element as said release signal, from said power source when switched into a second conducting state thereof, current regulating means for regulating an amount of current supplied from said power source, for supplying the small amount of current to the release element as said release signal, from said power source during at least the first conducting state of said switching means and for supplying the sufficient current to the release element as said release signal, in response to generation of the evaluating signal during the second conducting state of said switching means, and a checking circuit for the releasing circuit, comprising:

a) a check signal generator for generating a check signal which satisfies the predetermined evaluating condition and for applying the check signal to said first leading circuit, b) first means for determining whether or not said release signal and said first output signal responsive to the check signal during the first conducting state of said switching means satisfy a predetermined check condition indicative of normal operation of said evaluating circuit and said current regulating means, if not, determining a defect or malfunction of at least one of said evaluating circuit and said current regulating means, and c) second means for determining whether or not said first output signal during the check signal not being produced in the second conducting state of said switching means satisfies the predetermined evaluating condition in relation to supply of the sufficient current to the release element from said power source, if so, determining proper activation of the release element and if not, determining erroneous activation of the release element.

7. A releasing circuit as claimed in claim 6, wherein the checking circuit further comprises a buffer element connected at its input to said acceleration sensor through said first leading circuit and connected at its output to said evaluating circuit through a second leading circuit, said buffer element being arranged to permit only applying of said first signal from said first leading circuit to said second leading circuit therethrough, said second leading circuit producing a second output signal, wherein said check signal generator is arranged to apply the check signal to said second leading circuit, wherein said first means includes means for determining whether or not said release signal and said first and said second output signals responsive to applying the check signal to said second leading circuit during the first conducting state of said switching means satisfy the predetermined check condition, said first means being arranged for determining a defect or malfunction of at least one of said evaluating circuit and said current supply means when only said release signal does not satisfy the predetermined check condition and for determining a defect or malfunction of said buffer element when only said first signal does not satisfy the predetermined check condition, and wherein said second means includes means for determining whether said first and said second signals during the check signal not being produced in the second conducting state of said switching means satisfy the predetermined evaluating condition in relation to supply of the sufficient current to the release element from said power source, if so, determining proper activation of the release element and if not, determining erroneous activation of the release element caused by a defect or malfunction of one of said check signal generator and said current supply means.

8. A releasing circuit for a safety device having a release element which is actuated when supplied with a sufficient current for activation thereof from an electric power source, the safety device being actuated responsive to activation of the release element to protect passengers of a vehicle, comprising:

an acceleration sensor arranged to provide an acceleration signal responsive to acceleration of the vehicle, an evaluating circuit connected to said acceleration sensor through a first leading circuit for evaluating a first output signal of said first leading circuit in relation to a predetermined evaluating condition for supply of the sufficient current to the release element and for generating an evaluating signal when the evaluated result has satisfied the predetermined evaluating condition, switching means for permitting supply of a small amount of current, less than said sufficient amount, to the release element from said power source when switched into a first conducting state thereof and for permitting supply of the sufficient current to the release element from said power source when switched into a second conducting state thereof, current regulating means for regulating an amount of current supplied by said power source, to supply the small amount of current to the release element from said power source during at least the first conducting state of said switching means and to supply the sufficient current to the release element in response to generation of the evaluating signal during the second conducting state of said switching means, and a checking circuit for the releasing circuit comprising:

a) a first check signal generator for generating a first check signal which does not satisfy the predetermined evaluating condition and for applying the first check signal to said first leading circuit, b) a second check signal generator for generating a second check signal which satisfies the predetermined evaluating condition and for applying the second check signal to said first leading circuit, and c) first means for determining whether or not a first output signal of said first leading circuit responsive to the first check signal in the first conducting state of said switching means satisfies a first predetermined check condition indicative of normal operation of said first leading circuit, if not, determining a defect or malfunction of said first leading circuit, d) second means for determining whether or not a release signal appearing at the release element and said first output signal responsive to the second check signal in the first conducting state of said switching means satisfy a second predetermined check condition indicative of normal operation of said evaluating circuit and said current regulating means, if not, determining a defect or malfunction of at least one of said evaluating circuit and said current regulating means, and e) third means for determining whether or not said first output signal during the first and second check signals not being produced in the second conducting state of said switching means satisfies the predetermined evaluating condition in relation to supply of the sufficient current to the release element from said power source, if so, determining proper activation of the release element and if not, determining erroneous activation of the release element.

9. A releasing circuit as claimed in claim 8, wherein the first leading circuit comprises a buffer element connected at its input to said acceleration sensor through a buffer leading circuit that produces a buffer output signal which is applied to said buffer element, and a second leading circuit connecting said buffer element to said evaluating circuit, a second output signal of said second leading circuit connected to said evaluating circuit, said buffer element being arranged to permit only applying of a signal from said buffer leading circuit to said second leading circuit therethrough, wherein said second check signal generator includes means for applying the second check signal to said second leading circuit, wherein said first means includes means for determining whether or not said buffer output signal and said second output signal responsive to applying of the first check signal to said buffer leading circuit during the second check signal not being produced in the first conducting state of said switching means satisfy the first predetermined check condition, said first means including means for determining a defect or malfunction of said buffer leading circuit when said buffer output signal and said second output signal do not satisfy the first predetermined condition with each other and for determining a defect or malfunction of said second leading circuit when only the second output signal does not satisfy the first predetermined condition, wherein said second means includes means for determining whether or not said release signal, said buffer output signal and said second output signal responsive to applying of the second check signal to said second leading circuit during the first check signal not being produced in the first conducting state of said switching means satisfy the second predetermined check condition, said second means being arranged for determining a defect or malfunction of at least one of said evaluating circuit and said current regulating means when only the release signal does not satisfy the second predetermined check condition and for determining a defect or malfunction of at least one of said first check signal generator and said buffer element when only the buffer output signal does not satisfy the second predetermined condition, and wherein said third means includes means for determining whether or not said buffer output signal and said second output signal during the first and second check signals not being produced in the second conducting state of said switching means satisfy the predetermined evaluating condition in relation to supply of the sufficient current to the release element from said power source, if so, determining proper activation of the release element and if not, determining erroneous activation of the release element caused by a defect or malfunction of one of said second check signal generator and said current regulating means.

10. A releasing circuit as claimed in claim 9, wherein the buffer leading circuit further comprises an amplifier connected at its input to said acceleration sensor through an amplifier leading circuit and connected at its output to said buffer element through a third leading circuit, said amplifier being arranged for amplifying an amplifier signal appearing at said amplifier leading circuit and for applying the amplifying signal to said third leading circuit which produces a third output signal that is connected to said buffer element, wherein said first means includes means for determining whether or not said third output signal and said second output signal responsive to applying of the first check signal to said amplifier leading circuit during the second check signal not being produced in the first conducting state of said switching means satisfy the first predetermined check condition, said first means including means for determining a defect or malfunction of one of said amplifier leading circuit and third leading circuits when said third output signal and said second output signal do not satisfy the first predetermined condition with each other and for determining a defect or malfunction of said second leading circuit when only said second output does not satisfy the first predetermined condition, wherein said second means includes means for determining whether or not said release signal and said third and second output signals responsive to applying of the second check signal to said second leading circuit during the first check signal not being produced in the first conducting state of said switching means satisfy the second predetermined check condition, said second means including means for determining a defect or malfunction of at least one of said evaluating circuit and said current regulating means when only said release signal does not satisfy the second predetermined check condition and for determining a defect or malfunction of at least one of said first check signal generator and said buffer element when only said third output signal does not satisfy the second predetermined condition, and wherein said third means includes means for determining whether or not said third and second output signals during said first and said second check signals not being produced in the second conducting state of said switching means satisfy the predetermined evaluating condition in relation to supply of the sufficient current to the release element from said power source, if so, determining proper activation of the release element and if not, determining erroneous activation of the release element caused by a defect or malfunction of one of said second check signal generator and said current regulating means.

* * * * *